US008318288B2

(12) United States Patent
Bakker

(10) Patent No.: US 8,318,288 B2
(45) Date of Patent: Nov. 27, 2012

(54) OPTICAL ELEMENT, LITHOGRAPHIC APPARATUS INCLUDING SUCH OPTICAL ELEMENT AND DEVICE MANUFACTURING METHOD, AND DEVICE MANUFACTURED THEREBY

(75) Inventor: Levinus Pieter Bakker, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1087 days.

(21) Appl. No.: 10/981,736

(22) Filed: Nov. 5, 2004

(65) Prior Publication Data
US 2005/0122589 A1 Jun. 9, 2005

(30) Foreign Application Priority Data

Nov. 6, 2003 (EP) .................................... 03078495

(51) Int. Cl.
*G02B 17/00* (2006.01)
(52) U.S. Cl. ....................... 428/141; 359/591
(58) Field of Classification Search ............ 428/141, 428/156, 432, 433; 355/67; 359/591
See application file for complete search history.

(56) References Cited

U.S. PATENT DOCUMENTS

| 6,359,969 | B1 | 3/2002 | Shmaenok |
| 6,469,827 | B1 | 10/2002 | Sweatt et al. |
| 6,498,685 | B1 * | 12/2002 | Johnson ..................... 359/626 |
| 6,614,505 | B2 | 9/2003 | Koster et al. |
| 6,678,037 | B2 | 1/2004 | Van Elp et al. |
| 6,898,011 | B2 * | 5/2005 | Kandaka et al. ............ 359/584 |
| 7,031,428 | B2 * | 4/2006 | Dinger et al. .................. 378/34 |
| 2002/0097385 | A1 * | 7/2002 | Van Elp et al. ............... 355/67 |
| 2003/0077437 | A1 | 4/2003 | Nakamura et al. |
| 2003/0180632 | A1 * | 9/2003 | Eurlings et al. ............... 430/5 |
| 2004/0094724 | A1 | 5/2004 | Schuurmans et al. |
| 2005/0024614 | A1 | 2/2005 | Bakker |
| 2005/0112510 | A1 | 5/2005 | Bakker |

FOREIGN PATENT DOCUMENTS

| JP | 56-004107 | | 1/1981 |
| JP | 01-213599 | A | 8/1989 |
| JP | 05-181093 | | 7/1993 |
| JP | 11-202111 | A | 7/1997 |
| JP | 2002-122702 | A | 4/2002 |
| JP | 2002-184691 | A | 6/2002 |
| JP | 2003-185964 | A | 7/2003 |
| WO | WO 02/84671 | A1 * | 2/2002 |
| WO | WO 03016233 | A1 * | 2/2003 |

OTHER PUBLICATIONS

Glytsis et al., "Antireflection surface structure: dielectric layer(s) over a high spatial-frequency surface-relief grating on a lossy substrate," *Applied Optics* 27(20):4288-4304 (1988).
European Office Action issued for European Patent Application No. 04078050.4-2208 dated Mar. 6, 2007. Nayak, et al., "Characterization of Molybdenum/Silicon X-Ray Multilayers," Nuclear Instruments and Methods in Physics Research, B 199, (2003) 128-132.
Japanese Office Action issued for Japanese Patent Appln. No. 2004-321406, dated Jan. 28, 2008.

* cited by examiner

*Primary Examiner* — Maria Veronica Ewald
*Assistant Examiner* — Laura Auer
(74) *Attorney, Agent, or Firm* — Pillsbury Winthrop Shaw Pittman LLP

(57) ABSTRACT

An optical element includes a top layer which is transmissive for EUV radiation with wavelength $\lambda$ in the range of 5-20 nm, and a structure of the top layer is a structure having an rms roughness value equal to or larger than $\lambda/10$ for spatial periods equal to or smaller than $\lambda/2$. The structure promotes transmission through the top layer to the optical element.

11 Claims, 6 Drawing Sheets

OPTICAL ELEMENT, LITHOGRAPHIC APPARATUS INCLUDING SUCH OPTICAL ELEMENT AND DEVICE MANUFACTURING METHOD, AND DEVICE MANUFACTURED THEREBY

This application claims priority to European Patent Application 03078495.3, filed Nov. 6, 2003, the contents of which are herein incorporated by reference.

BACKGROUND OF THE INVENTION

1. Field of the Invention

The present invention relates to an optical element, a lithographic apparatus including such optical element, a device manufacturing method and a device manufactured thereby.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion at once, and scanners, in which each target portion is irradiated by scanning the pattern through the beam of radiation in a given direction (the "scanning" direction) while synchronously scanning the substrate parallel or anti-parallel to this direction.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

Some EUV sources, especially plasma sources, emit radiation over a wide range of frequencies, even including infrared (IR), visible, ultraviolet (UV) and deep ultraviolet (DUV). These unwanted frequencies will propagate and cause heating problems in the illumination and projection systems and cause unwanted exposure of the resist if not blocked; although the multilayer mirrors of the illumination and projection systems are designed for reflection of the desired wavelength, e.g. 13 nm, they are optically flat and have quite high reflectivities at IR, visible and UV wavelengths. It is therefore necessary to select from the source a relatively narrow band of frequencies for the beam of radiation. Even where the source has a relatively narrow emission line, it is desirable to reject radiation out of that line, especially at longer wavelengths. It has been proposed to use a thin membrane as a filter to perform this function. However, such a film is very delicate and becomes very hot, 200-300° C. or more, leading to high thermal stresses and cracking, sublimation and oxidation in the high power levels necessary in a lithographic projection apparatus. A membrane filter also generally absorbs at least 50% of the desired radiation.

U.S. Pat. No. 6,678,037 describes a lithographic projection apparatus wherein a grating spectral filter is used in the radiation system of the lithographic projection apparatus. This grating spectral filter is designed for passing radiation of desired wavelengths to form a beam of radiation and for deflecting radiation of undesired wavelengths. The grating spectral filter is substantially formed of a material having a complex refractive index close to unity at the desired wavelengths and includes silicon protrusions (this structure is 'invisible' for the EUV radiation). The protrusions have a laminar sawtooth profile or a laminar square wave profile (FIGS. 3 and 4 of U.S. Pat. No. 6,678,037, respectively). Further, the structures might have a Ru coating creating an rms surface roughness of 1 nm.

A problem with optical filters with such coatings is that they also reflect a large amount of desired radiation, whereas transmission (through the protrusions) is required.

SUMMARY OF THE INVENTION

It is an aspect of the present invention to provide improved optical elements, like filters, lenses, etc., having a layer that promote transmission through at least a part of the optical element or decrease reflection of desired wavelengths. Such optical elements may be used in a lithographic projection apparatus to select EUV radiation from a wide band source and/or to reject unwanted frequencies, but may also be used in other applications, e.g. in the UV or visible light (VIS).

It is another aspect of the present invention to provide an optical element, for example an optical filter, an optical grating, a mirror, a lens, etc., with a layer that has a decreased reflection of incoming EUV radiation with a wavelength $\lambda$ in the range of 5-20 nm.

According to an embodiment of the present invention an optical element includes a layer that is at least partially transmissive for EUV radiation with a wavelength $\lambda$ in the range of 5-20 nm, and a top layer including a structure having an rms roughness value, wherein the top layer is transmissive for EUV radiation with wavelength $\lambda$ in the range of 5-20 nm, and the structure of the top layer is a structure having an rms roughness value equal to or larger than $\lambda/10$ for spatial periods equal to or smaller than $\lambda/2$.

Such an optical element reduces reflection of radiation (e.g. projected with a certain angle of incidence) on the surface of the optical element, especially on the transmissive top layer, due to the presence of this transmissive top layer with a structure. Hence, more radiation is transmitted through the transmissive top layer and/or the (partially) transmissive layer of the optical element (see e.g. E. Spiller, Soft Ray Optics, SPIE Optical Engineering Press, US, 1994, ISBN 0-8194-1655-x). In this way, more radiation reaches the optical element, and thus, the optical element may provide a desired filter function.

In a further embodiment, the structure of the transmissive top layer has an rms roughness equal to or smaller than $\lambda$ for spatial periods larger than $\lambda/2$ and equal to or smaller than 1 µm. In yet a further embodiment, the at least partially transmissive layer includes a surface with a structure with an rms roughness value equal to or larger than $\lambda/50$ and equal to or smaller than $\lambda$ for spatial periods larger than about $\lambda/2$ and equal to or smaller than about 1 µm, or a structure with an rms roughness value equal to or larger than about $\lambda/50$ and equal to or smaller than about $\lambda/2$ for spatial periods larger than about $\lambda/2$ and equal to or smaller than about 1 µm.

In yet another embodiment, the transmissive top layer is composed of a material with a relatively low imaginary part of the index of refraction for radiation with wavelength $\lambda$ in the range of 5-20 nm. For example, for EUV applications, the transmissive top layer includes a material selected from Be, B, C, Si, P, S, K, Ca, Sc, Br, Rb, Sr, Y, Zr, Nb, Mo, Ru, Rh, Ag, Ba, La, Ce, Pr, Ir, Au, Pa or U. All these elements have an attenuation length for EUV radiation larger than about 100 nm. Combinations of materials may also be chosen, for example $B_4C$ or SiC, etc. In another embodiment, the transmissive top layer includes one or more materials selected from Be, B, C, Si, Zr, Nb, Mo or Ru. The material of the structure may be different from the material of the transmissive top layer. However, they may also be the same.

In still another embodiment, the transmissive top layer includes at least Ru. Ru is relatively more stable to oxidation than, for example, Si. In this way, subwavelength roughness is introduced by a relatively stable transmissive top layer including the structure. Such transmissive top layer also provides protection of the optical element, for example to oxidation. In another embodiment, the transmissive top layer and the structure include Ru. In U.S. Pat. No. 6,678,037, the Ru layer may only provide protection but the presence of this Ru layer in U.S. Pat. No. 6,678,037 also enhances reflection. In contrast to U.S. Pat. No. 6,678,037, the transmissive top layer including the structure according to the invention may both protect and diminish reflection that may otherwise be generated by such protective layer, as in U.S. Pat. No. 6,678,037. Other materials, next to Ru, that may be chosen for the transmissive top layer of the invention and which may provide a relatively chemically inert layer are Au, Rh, Ir, Ag, C, etc.

In a further embodiment, the structure having an rms roughness value equal to or larger than $\lambda/10$ has spatial periods equal to or smaller than $\lambda/2$, for example $\lambda/5$ or smaller. When the spatial period of the structure is below $\lambda/2$, then the reflection loss is 'converted' into transmission gain. For EUV radiation of about 13.5 nm, the spatial period may be about 6 nm or smaller, 5 nm or smaller, 2.5 nm or smaller, 2 nm or smaller, or equal to or smaller than about 1 nm. In another embodiment, the transmissive top layer may be a layer wherein the rms value is about $\lambda/5$ or larger, or $\lambda/2$ or larger, or $\lambda$ or larger, or $2*\lambda$ or larger, e.g. about 2 nm or larger, 2.5 nm or larger, 5 nm or larger, 6 nm or larger, 10 nm or larger, or about 13.5 nm or larger for EUV radiation of about 13.5 nm or even larger, e.g. 20 or 50 nm for above mentioned spatial period equal to or smaller than $\lambda/2$. Good results for EUV applications may be obtained with rms roughness values between 1.5 and about 50 nm, e.g. 2-20 nm. Further, this rms roughness between about 1.5 and about 50 nm may be selected for spatial periods equal to or smaller than $\lambda/2$, e.g. between about 10-2.5 nm (upper values ($\lambda/2$)) and about 1.0-4 nm (lower values ($\lambda/5$)).

In yet a further embodiment, the structure of the top layer is a structure having an rms roughness value equal to or larger than about $\lambda/10$ and equal to or larger than about $4*\lambda$, for spatial periods equal to or smaller than about $\lambda/2$. In a still further embodiment, the structure of the top layer is a structure having an rms roughness value equal to or larger than about $\lambda/10$ and equal to or larger than about $4*\lambda$, for spatial periods equal to or smaller than about $\lambda/2$ and equal to or larger than about $\lambda/5$.

In yet a further embodiment, there is provided an optical element including the top layer with a structure, the structure having an rms roughness value equal to or larger than about $\lambda/10$ and equal to or smaller than about $4*\lambda$, for spatial periods equal to or smaller than about $\lambda/2$ and equal to or larger than about $\lambda/5$; and an rms roughness value equal to or larger than about $\lambda/50$ and equal to or smaller than about $\lambda$ for spatial periods larger than about $\lambda/2$ and equal to or smaller than about 1 µm.

Spatial periods and rms roughness can be determined by existing techniques, for example optical scattering techniques, STM, AFM, interferometrics, etc.

In yet another embodiment, the transmissive top layer includes a layer with a thickness of up to about 10 nm, or up to about 20 nm, for example about 10-20 nm.

In another embodiment, the at least partially transmissive layer, i.e. the layer over which the transmissive top layer of the invention is present, has the surface with the structure with a certain roughness. This transmissive layer may be a lens, a layer on a mirror, for example a grazing incidence mirror including such at least partially transmissive layer, for example a Mo layer, or a foil, etc. Such transmissive or reflective layers are usually polished or otherwise surfaced, such that a certain maximum roughness is obtained. For example, an optical element with a partially transmissive layer with a substantially flat surface may be applied, wherein the substantially flat surfaces of the partially transmissive layer includes a surface with a structure with an rms roughness value equal to or smaller than $\lambda$. The rms roughness may also be equal to or smaller than about $\lambda/2$ or equal to or smaller than about $\lambda/5$. On top of this substantially flat surface, the transmissive top layer including the structure according to the present invention is present.

In a further embodiment, the optical element of the invention may also include a layer with transmissive protrusions, for example in the case of a reflective mirror, having a mirroring surface, including one or more protrusions transmissive for EUV radiation with wavelength $\lambda$ in the range of 5-20 nm. The transmissive top layer according to the present invention with the structure may be present on those protrusions, on the layer or surface between the protrusions or on both protrusion and layer or surface between the protrusions. Due to the presence of this transmissive top layer, less radiation with wavelength $\lambda$ in the range of 5-20 nm may be reflected and more radiation may be guided to the optical element, for example through the transmissive protrusions.

In a further embodiment, the optical element includes a mirror, having a mirror surface, wherein the mirror surface includes one or more protrusions transmissive for EUV radiation with wavelength $\lambda$ in the range of 5-20 nm, and at least part of the mirror surface further includes the transmissive top layer including the structure. Such an optical element may be according to European Patent Application 03077155, incorporated herein by reference. In a variation of this embodiment, the mirror surface includes protrusions including a material selected from Be, B, C, Si, P, S, K, Ca, Sc, Br, Rb, Sr, Y, Zr, Nb, Mo, Ru, Rh, Ag, Ba, La, Ce, Pr, Pa or U and combinations thereof.

In a further variation on this embodiment, the mirror surface includes one or more first protrusions including a first material selected from Be, B, C, P, S, K, Ca, Sc, Br, Rb, Sr, Y, Zr, Nb, Mo, Ru, Rh, Ag, Ba, La, Ce, Pr, Pa or U and combinations thereof, and one or more second protrusions including a second material selected from Be, B, C, Si, P, S, K, Ca, Sc, Br, Rb, Sr, Y, Zr, Nb, Mo, Ru, Rh, Ag, Ba, La, Ce, Pr, Pa or U and combinations thereof, and the first and second materials are not the same. On top of these first and/or second protrusions, the transmissive top layer according to the present invention is provided.

In another embodiment, an optical element with at least one surface includes a profile having height differences, thereby providing cavities and elevations having a predetermined maximum height difference, wherein the optical element further includes a substantially flat transmissive layer in the cavities and on the elevations of the optical element, according to U.S. patent application Ser. No. 10/936,716, filed Sep. 9, 2004, incorporated herein by reference, and the optical element further includes the transmissive top layer including the structure according to the present invention, for example on the substantially flat transmissive layer.

According to another embodiment, a lithographic apparatus includes one or more optical elements according to the present invention. Such lithographic apparatus may include an illumination system configured to a beam of radiation; a support configured to support a patterning device, the patterning device configured to pattern the beam of radiation according to a desired pattern; a substrate table configured to hold a substrate; and a projection system configured to project the patterned beam onto a target portion of the substrate.

In a further aspect, the present invention is directed to a device manufacturing method including providing a beam of radiation; patterning the beam of radiation with a pattern in its cross-section; projecting the beam of radiation onto a target portion of a substrate after its patterned, wherein the beam of radiation is incident on an optical element according to the present invention.

According to yet another aspect of the invention there is provided a device which is manufactured according to the method of the present invention.

In the context of the present invention, "optical element" includes one or more of optical filters, optical gratings, mirrors and lenses. Such optical elements may be flat or curved and may be present as layer, foil, device, etc. They may be blazed or optimised, e.g. for radiation with a predetermined wavelength $\lambda$ in the range of 5-20 nm. They may be transmissive for radiation with wavelengths $\lambda$, e.g. in the case of lenses, or reflective, e.g. in case of mirrors, or diffractive, e.g. in the case of gratings. Some optical elements may provide one or more of these optical effects; see e.g. U.S. patent application Ser. Nos. 10/887,306 and 10/936,716. The optical elements of the present invention at least include a partially transmissive layer and a transmissive top layer including a structure. It should be appreciated that the optical element may also include other layers, features, etc. These layers may also be between the partially transmissive layer and a transmissive top layer.

"Transmissive" or "substantially transmissive" in this context means that the transmission through a transmissive layer, e.g. a EUV transmissive layer, is larger than zero, for example at least 30%, or at least 50%, at least 70%, at least 80%, at least 90%, or at least 95%, or at least 98%. Alternatively, transmissive may also mean that attenuation through the transmissive layer or through a transmissive protrusion is smaller than about 1/e (0.368). Herein, attenuation length is defined as the length wherein the transmittance has reduced to a value of 1/e, as would be understood by one of ordinary skill in the art.

"Not absorbed" or "substantially not absorbed" in this context means that the absorption of radiation is less than 100%, or less than 70%, or less than 50%, or less than 30%, or less than 20%, or less than 10%, or less than 5%, or less than 2%.

It should be appreciated that "transmissive" as well as "not absorbed" does not only depend on the transmission or absorbance of the material, but also on other factors, for example layer thickness. For example, due to the fact that the transmissive layer including a structure according to the present invention may be relatively thin, also relatively less transmissive materials like Ru, Au etc. may be applied here, transmissive with respect to EUV radiation.

"Undesired radiation" or "undesired wavelength" refers to radiation having wavelengths larger or smaller than the wavelength that is intended to be used. For example, when EUV radiation with a wavelength of about 13.5 nm is desired, radiation with a wavelength smaller than about 10 nm or larger than about 20 nm is not desired. This means that the phrase "radiation with wavelength $\lambda$ in the range of 5-20 nm" is not intended to be limited to radiation with an infinite small bandwidth of $\lambda$, as will be understood by those of ordinary skill in the art. An optical element may be designed for one specific wavelength $\lambda$ or a range of wavelengths. An optical element may also be used at different wavelengths, e.g. due to second order effects, etc.

In the context of the invention, a "structure" is defined as a structure which may be present on a layer or on a surface, or which can be seen as surface, providing height differences. The structure may include randomly ordered height differences (random structure) or ordered height differences (e.g. one or two dimensional ordering of the height differences).

In the context of the invention, a "random structure" is defined as a structure which may be present on a layer or on a surface, or which can be seen as surface, and which does not include a regular pattern or does not include an intended regular pattern or profile. For example, after surfacing, for example polishing, there might be found some regularity, but this regularity may not be intentional. In contrast to that, in the case of gratings, the protrusions forming the grating profile have an intended regular pattern. A random structure may be obtained by deposition sputtering or otherwise depositing structures of a certain dimension (e.g. 2, 5 or 10 nm diameter) on a surface. This will appear in a stochastic way. The layer including a random structure may also be obtained by depositing a layer and subsequently sputtering part of the layer away.

The term "layer" describes layers having one or more boundary surfaces with other layers and/or with other media like vacuum (in use). However, "layer" may also mean part of a structure, as will be understood by those of ordinary skill in the art. The term "layer" may also indicate a number of layers. These layers can be next to each other or on top of each other, etc. They may include one material or a combination of materials. "Layers" may be continuous or discontinuous layers. For example, protrusions on a surface may also be seen as separate layers or as a discontinuous layer. This means that the layer that is at least partially transmissive for EUV radiation according to the invention may include protrusions.

The "transmissive top layer" of the present invention includes the structure, but may also essentially only include the structure. The transmissive top layer of the present invention may be a separate layer, for example on protrusions or on a transmissive layer, but may also be part of the at least partially transmissive layer of the optical element. At least part of the transmissive top layer of the invention includes the structure according to the present invention.

In the present invention, the "at least partially transmissive layer" of the optical element is a layer that is (substantially) transmissive for desired radiation with wavelength $\lambda$ in the range of 5-20 nm. "Partly" in this context describes the fact that the layer is not necessarily completely transmissive, for example at the boundaries. The transmissiveness of this layer will depend on, for example, the wavelength of the radiation and angle of incidence of the beam of radiation, as will be understood by those of ordinary skill in the art. This also means that a layer can both be reflective and transmissive. Next to that, depending on the wavelength, angle of incidence of the beam of radiation and a possible ordering (like e.g. a grating) of this layer, the layer may also have refractive effects. However, when applying an optical element according to the present invention, one of these optical effects will mainly be used with respect to radiation with wavelength λ in the range of 5-20 nm, hereby not excluding the possible use of other effects and/or at other wavelengths than at λ. The "at least partially transmissive layer" in the present invention may include ordered protrusions, a layer on and/or between protrusions, a lens, or layer on a lens, etc.

In the invention, "protrusions", which are present on the mirror surface, are defined as structures extending from the mirror surface that may include a material selected from Be, B, C, Si, P, S, K, Ca, Sc, Br, Rb, Sr, Y, Zr, Nb, Mo, Ru, Rh, Ag, Ba, La, Ce, Pr, Pa or U and combinations thereof. These protrusions may be made via lithographic techniques. In such a technique, the upper surface is polished to a very good surface roughness and grooves are etched with the lands defined by a photoresist pattern. In this way, a certain profile is obtained, for example a laminar block or laminar sawtooth. The profile may also be provided by ruling (scratching a line in) a layer of a first material with a diamond tool.

These protrusions on a mirror surface may have a laminar sawtooth profile, wherein the protrusions have a sawtooth profile that is laminarly arranged on the mirror surface. The profile can be arranged to form a blazed one dimensional grating, with a certain number of parallel lines (laminar sawtooth protrusions). The protrusions may also have a laminar square wave profile, wherein the protrusions have a square or rectangle structure, that is laminarly arranged on a mirror surface. The profile can be arranged to form a one dimensional grating, with a certain number of parallel lines (laminar square wave protrusions).

The protrusions might also be periodically arranged in two directions. For example, the protrusions may have periodically structured sawtooth profile, wherein the protrusions may be cubes or rectangles which have a sawtooth profile in one direction, and which are periodically arranged, like a checkerboard. The profile can be arranged to form a blazed two dimensional grating, with a certain number of periodically arranged structures (periodical sawtooth protrusions). A further embodiment of a periodically arranged profile in two directions is a structure with a periodically structured square wave profile, wherein the protrusions can e.g. be cubes or rectangles which are periodically arranged, like a checkerboard. The profile can be arranged to form a blazed two dimensional grating, with a certain number of periodically arranged cubes or rectangles (periodical square wave protrusions). When using such two dimensional profiles, the protrusions may be arranged in a block structure of sawtooth protrusions (free standing periodical sawtooth protrusions) or block protrusions (free standing periodical square wave protrusions; with cubes or rectangles), as described for example in U.S. Pat. No. 6,469,827 or E. Hecht, "Optics", second edition, p. 430 (paragraph 10.2.7).

In the present invention, calling a protrusion "first" and "second" protrusion is only a method to indicate the different protrusions of different materials. These terms do not imply a certain order.

The protrusions or elevations form a "profile", for example a grating, and provide on the surface of such optical elements "cavities" (areas which are deeper with respect to adjacent areas), and which can be seen as the area (two dimensionally speaking) between protrusions or elevations (areas which are higher with respect to adjacent areas). The protrusions may be flat and have equal heights. The cavities may be flat and have equal depths and may thus be equal to the height of the protrusions. This means that the height of the protrusions is a predetermined maximum height difference. In case the protrusions and cavities are not flat, the maximum height difference between the bottom surface of the cavities and the top surface of the elevations is the predetermined maximum height. In general, the maximum height difference between the top surface of the elevation and the bottom surface of the cavity may be determined and is the "predetermined maximum height difference".

In the context of the present invention, "first height" means the height in the cavities which is obtained after providing a transmissive layer in the cavities and on the elevations of the optical elements, but before surfacing. Due to a subsequent surfacing procedure, the first height is reduced such that a height in the cavities is obtained that is larger than the predetermined maximum height difference. Further, the term "second height" refers to the height of the transmissive layer, e.g. a EUV transmissive layer, on the elevations that is obtained after surfacing, e.g. polishing.

"Substantially zero" means that the second height of the layer above the protrusions or elevations may be reduced, within practical limits of surfacing methods, to substantially zero, e.g. a few nanometers or less. Before surfacing, the transmissive layer in the cavities has a first height. When surfacing, e.g. polishing or etching, the height of the transmissive layer is reduced, and thus the first height is reduced too, such that the second height on the elevations that is obtained after surfacing is substantially zero or larger. When the height of the transmissive layer is reduced until the height over the elevations (second height) is substantially zero, the first height is also reduced, resulting in a final height in the cavities that is "substantially equal" to the predetermined maximum height difference. When the layer height in the cavity is substantially equal to the predetermined maximum height difference, there may be a difference of e.g. only a few nanometers or less between these heights.

The phrase "a substantial planar surface in the cavities and over the elevations" describes the situation that a substantially continuous transmissive layer is present on at least part of the optical element, thereby providing such layer in the cavities and on the elevations.

In the present invention, "material" may also be interpreted as combination of materials. The phrase "material selected from Be, B, C, Si, P, S, K, Ca, Sc, Br, Rb, Sr, Y, Zr, Nb, Mo, Ru, Rh, Ag, Ba, La, Ce, Pr, Ir, Au, Pa or U" herein also includes materials including one or more of these elements, for example silicon nitride $Si_3N_4$, boron nitrides BN, calcium nitrides $Ca_3N_2$, etc.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength λ of 365, 248, 193, 157 or 126 nm) and extreme ultra-violet (EUV) radiation (e.g. having a wavelength in the range of 5-20 nm), as well as particle beams, such as ion beams or electron beams. Herein, the phrase "in the range of 5-20 nm" refers to radiation having a wavelength between at least part of 5-20 nm. It should be appreciated that the present invention may also be used for radiation having a wavelength in the EUV or soft X-ray outside this range, e.g. about 1 nm or 25 nm.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support supports, e.g. bares the weight of, the patterning device. It holds the patterning device in a way depending on the orientation of the patterning device, the design of the lithographic apparatus, and other conditions, for example whether or not the patterning device is held in a vacuum environment. The support may use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
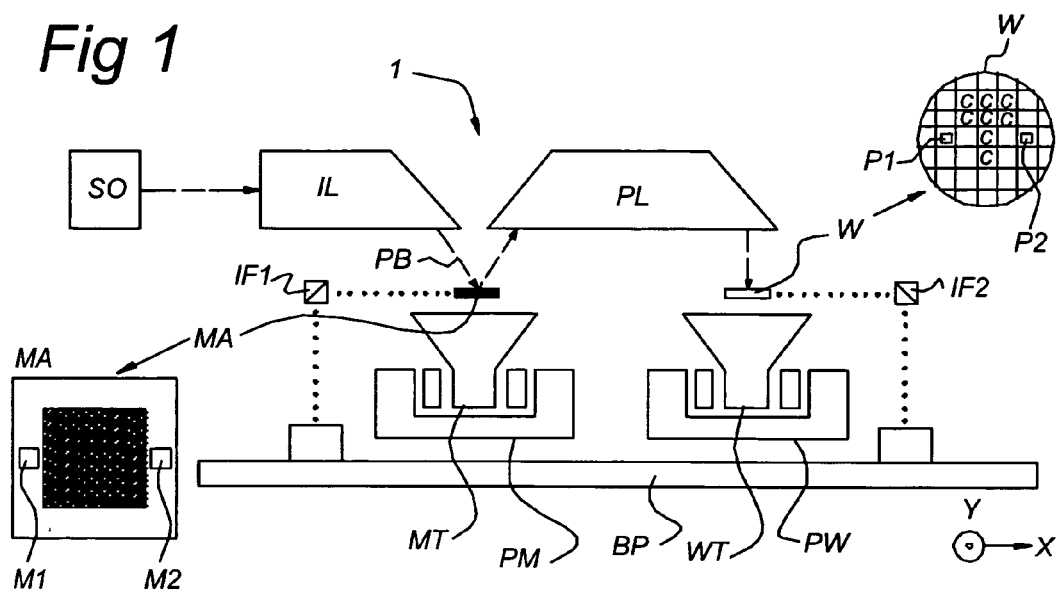
FIG. 1 schematically depicts a lithographic apparatus according to an embodiment of the present invention.

FIG. 1 schematically depicts a lithographic apparatus 1 according to the present invention. The apparatus 1 includes a base plate BP. An illumination system (illuminator) IL is configured to provide a beam of radiation PB of radiation (e.g. UV or EUV radiation). A first support (e.g. a mask table) MT is configured to support a patterning device (e.g. a mask) MA and is connected to a first positioning device PM that accurately positions the patterning device with respect to a projection system PL. A substrate table (e.g. a wafer table) WT is configured to hold a substrate (e.g. a resist-coated wafer) W and is connected to second positioning device PW that accurately positions the substrate with respect to the projection system PL. The projection system (e.g. a reflective projection lens) PL is configured to image a pattern imparted to the beam of radiation PB by patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector including, for example, suitable collecting mirrors and/or a spectral purity filter. In other cases the source may be integral part of the apparatus, for example when the source is a mercury lamp. The source SO and the illuminator IL, may be referred to as a radiation system.

The illuminator IL may include an adjusting device(s) configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB having a desired uniformity and intensity distribution in its cross-section.

The beam of radiation PB is incident on the mask MA, which is held on the mask table MT. Being reflected by the mask MA, the beam of radiation PB passes through the projection system PL, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 (e.g., an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
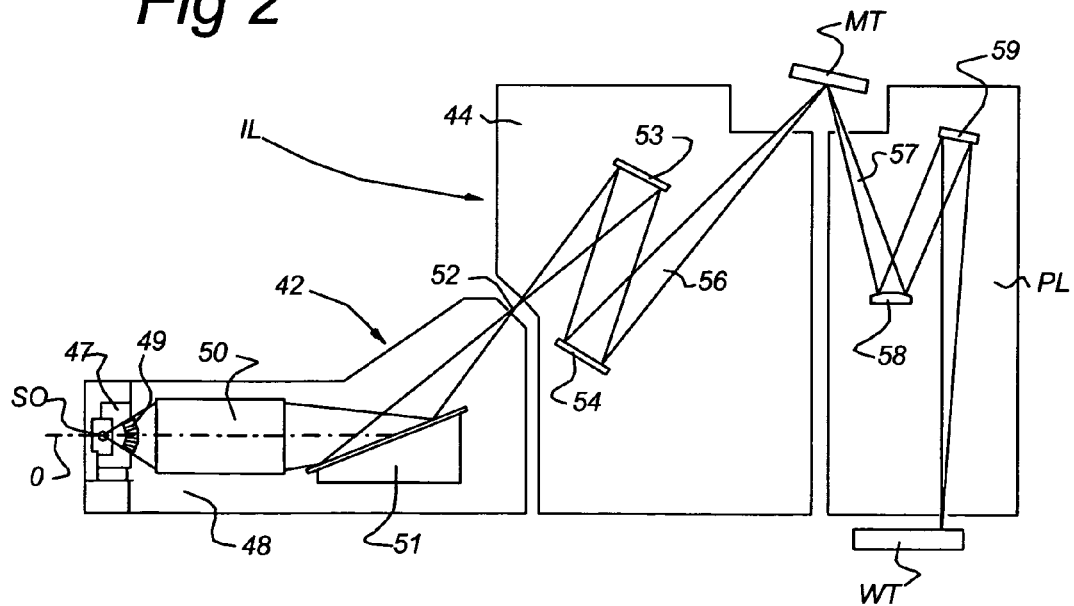
FIG. 2 schematically depicts a side view of an EUV illumination system and projection optics of a lithographic projection apparatus according to FIG. 1.

FIG. 2 shows the apparatus 1 in more detail, including a radiation system 42, an illumination optics unit 44, and the projection system PL. The radiation system 42 includes the radiation source SO which may be formed by a discharge plasma. EUV radiation may be produced by a gas or vapor, such as Xe gas or Li vapor in which a very hot plasma is created to emit radiation in the EUV range of the electromagnetic spectrum. The very hot plasma is created by causing a partially ionized plasma of an electrical discharge to collapse onto an optical axis O. Partial pressures of e.g. 10 Pa of Xe or Li vapor or any other suitable gas or vapor may be required for efficient generation of the radiation. The radiation emitted by radiation source SO is passed from a source chamber 47 into a collector chamber 48 via a gas barrier or contamination trap 49. The gas barrier 49 includes a channel structure, for example as described in detail in U.S. Pat. Nos. 6,614,505 and 6,359,969, which are incorporated herein by reference.

The collector chamber 48 includes a radiation collector 50 which may be formed by a grazing incidence collector. Radiation passed by collector 50 is reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection optics system PL via reflective elements 58, 59 onto wafer stage or substrate table WT. More elements than shown may generally be present in illumination optics unit 44 and projection system PL.

Radiation collectors 50 are known. One example of a radiation collector that may be used in the present invention is described in U.S. Patent Application Publication No. 2004/0094724 A1. See, for example, FIGS. 3, 4 and 5.

Figure 3:
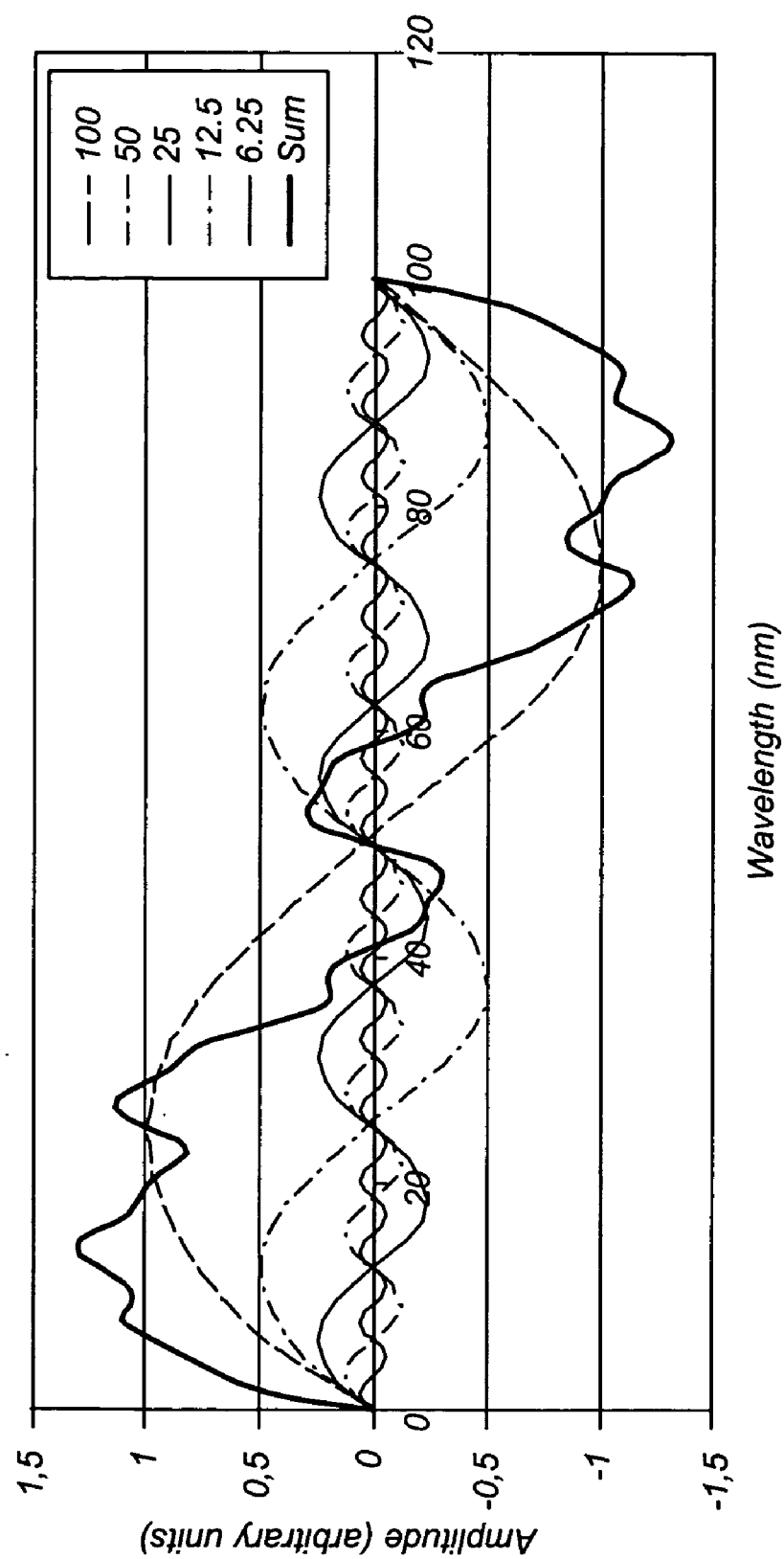
FIG. 3 schematically depicts a cross section of a theoretical rough surface.

Having generally described a lithographic apparatus, a few general notes are made on roughness of surfaces. A rough surface generally includes a structure that provides a height profile. The structure includes smaller structures, thereby providing height differences. The height profile of such a surface may be provided by known techniques. The height profile can be defined as the difference of the local height with respect to the average height of the profile. Since structures on rough surfaces may be randomly positioned, it is not necessary to define the fully detailed height profile, i.e. it is not necessary to know the height of the profile at every position. A set of numbers describing the key features of the structure is adequate. A convenient set of numbers is the root mean square (rms) roughness value of the height for a set of characteristic lengths over the surface. This is illustrated in FIG. 3, wherein a schematic cross section of a rough surface profile (irregularly curved thick line) is depicted. In FIG. 3, five sine functions are plotted which are included in the rough surface profile. The structures in the profile appear as randomly ordered. It is clear that the long wavelength sine is still dominant in the profile.

In FIG. 3, the relative amplitude of the sine functions is chosen to be proportional to the wavelength. Table 1 sums up these relative numbers:

TABLE 1 the wavelengths and amplitudes of the sine waves in FIG. 3:

| Spatial period (nm) | Amplitude (a.u.) |
|---|---|
| 100 | 1 |
| 50 | 0.5 |
| 25 | 0.25 |
| 12.5 | 0.125 |
| 6.25 | 0.0625 |

The sine wave with the longest wavelength describes the relatively slow variation of the height. Furthermore, the shorter the wavelength of the sine wave, the faster the variation of the height it describes is. The structure of FIG. 3 may be repeated a number of periods, thereby providing a kind of regular structure, with the desired rms roughness according to the present invention.

The profile in FIG. 3 can thus be characterised by the five sets of numbers (Fourier analysis of the profile) given in Table 1. Note that in this case, the numbers in Table 1 completely define the profile in FIG. 3. In general, this is not the case, since more than, for example five, wavelengths are needed for the decomposition. The amplitude of the sine wave as a function of the wavelength is referred to as 'power spectral density' in literature. The wavelength is also called 'spatial period'. Another term that is frequently used is 'spatial frequency', this frequency is equal to 1 over the spatial period. Fourier analysis of the structure or height profile of a rough surface provides the power spectral density of the height profile.

The amplitudes of the sine waves, along with their spatial periods are enough to characterise the height profile of the structure. Therefore, in order to characterise the height profile of the structure, the profile is decomposed it into a set of sine waves with properly chosen spatial periods. The corresponding amplitudes then characterise the structure. In literature, roughness is frequently characterised using the root mean square value of the sine wave, i.e. $\frac{1}{2}\sqrt{2}$ times the amplitude of the wave.

The spatial period (i.e. the wavelength) of the roughness is a quantity to be considered for optical components. For EUV mirrors, roughness with spatial frequencies smaller than 1 $mm^{-1}$ (i.e. spatial periods larger than 1 mm) may result in problems with the image quality as resolution and distortion. Mid-spatial frequency roughness ($1-10^{-3}$ $mm^{-1}$, i.e. spatial periods between 1 μm and 1 mm) results in flare, and high spatial frequency roughness ($10^{-3}$-$mm^{-1}$, i.e. spatial periods larger than 1 μm) appears to result in reflection loss. Hence, the physical effect of roughness depends heavily on the spatial frequency of the roughness. Note that for real surfaces, the roughness is characterised or specified over a range of spatial periods, since a single spatial period does not describe the whole effect of roughness. This also means that the rms values are calculated using not a single sine wave, but a superposition of sine waves with spatial periods in a certain bound range.

The present invention is based on the fact that a surface with very fine roughness, i.e. with spatial periods (wavelengths) smaller than about half of the wavelength of the incident light, may not produce, or produces less, scattered light, and the loss in reflectivity may be partially compensated by an increase in the transmission.

For example, when used in EUV lithography, the wavelength of the light may be 13.5 nm. Thus the spatial period of the roughness may be lower than about 6.75 nm. In order to have approximately all the light transmitted through the structure, significant rms roughness is required. For example, at 15 degrees angle of incidence on a Ru structure, an 8 nm rms roughness results in approximately 36% reflection loss, i.e. more than about 36% of the incident light is transmitted. A higher roughness may result in an even higher transmission. Roughness with spatial periods larger than about 6.75 nm will result in more scattering, and hence more loss of desired radiation.

Figure 4A:
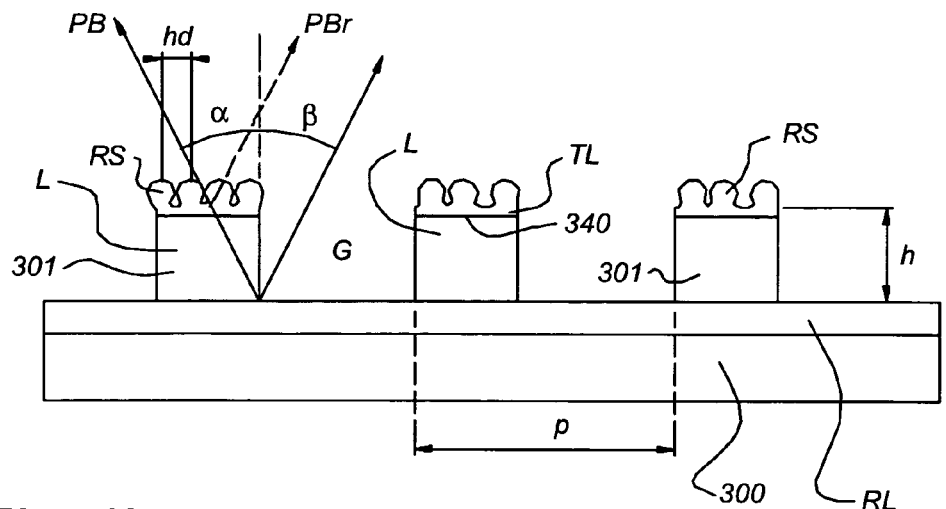
FIG. 4a schematically depicts an optical filter having a mirror surface (reflective layer) and protrusions in the form of a laminar square wave profile and a transmissive top layer according to an embodiment of the present invention.

One or more of the mirrors of FIG. 2, for example the filter 51, may be an optical element, as depicted in FIG. 4a, including a mirror or optical filter 300, having a mirror surface or reflective layer RL, wherein the mirror surface includes one or more protrusions 301 (substantially) transmissive for EUV radiation with a wavelength λ in the range of 5-20 nm. See also U.S. patent application Ser. No. 10/887,306, filed Jul. 9, 2004, incorporated herein by reference. The mirror surface further includes a transmissive top layer TL including a structure RS according to the present invention.

Figure 4B:
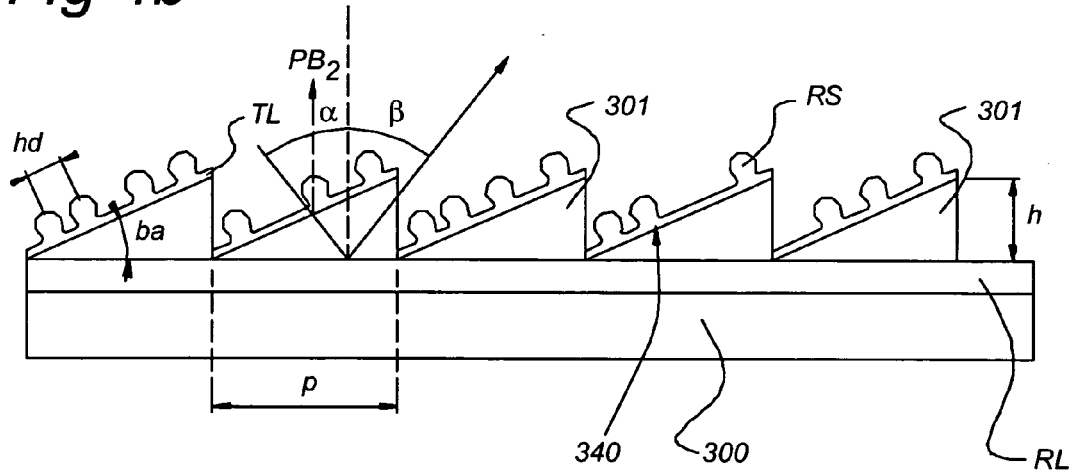
FIG. 4b schematically depicts an optical filter having a mirror surface (reflective layer) and protrusions in the form of a laminar sawtooth profile and a transmissive top layer according to an embodiment of the present invention.
Figure 4C:
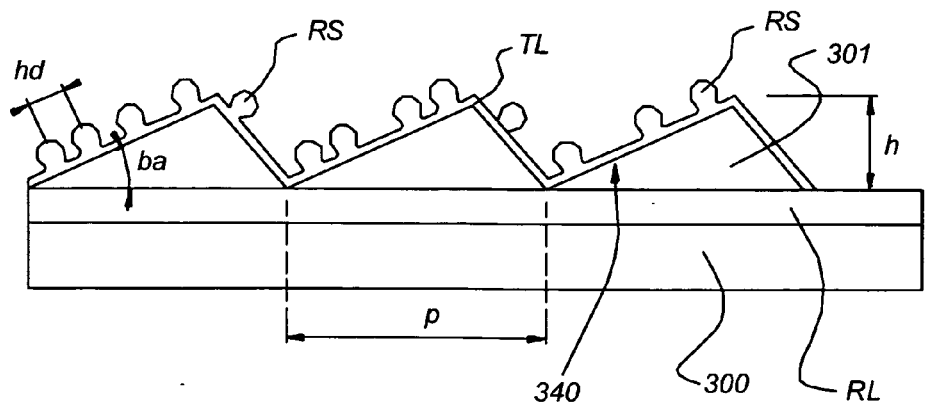
FIG. 4c schematically depicts an optical filter having a mirror surface (reflective layer) and protrusions in the form of a laminar asymmetrical two-sided sawtooth profile and a transmissive top layer according to an embodiment of the present invention.

Such an optical filter or mirror 300 may have a protrusion profile with a laminar square wave profile as shown in FIG. 4a, a laminar sawtooth structure as shown in FIG. 4b, or a laminar asymmetrical two-sided sawtooth profile as shown in FIG. 4c, etc.

FIG. 4a schematically shows an optical filter or mirror 300, having a reflective layer or mirror surface RL, wherein the mirror surface is provided with a laminar square wave profile. The square wave profile is formed by protrusions 301 (G, groove; L, land) which have a period or pitch p of, for example, between 500-5000 nm, a height h of, for example, 12-20 nm. On the protrusions 301, on surface 340, which are regularly arranged, a transparent top layer TL is provided, with, on this layer or in this layer or as part of the layer TL, a randomly arranged structure RS. Distances hd between the structures included in structure RS and the heights and diameters thereof might vary over the transparent layer TL and over the protrusions 301 of optical filter or mirror 300 comparable to the structure shown in FIG. 3 thereby providing the transmissive top layer TL with structure RS.

The structure RS may have an rms roughness value equal to or larger than λ/10, for example about 1.5 nm, for spatial periods equal to or smaller than λ/2, or about 6.75 nm or less for EUV radiation. However, the spatial periods might also be smaller, for example 3 or 1 nm, and the rms value may be about 5 or 10 nm. Generally, a higher rms value for these spatial periods leads to a better result, since the reflection loss at the surface at constant wavelength and under the same angle of incidence of the radiation decreases with an increasing rms roughness.

Referring to FIGS. 4a and 4b, a beam of radiation PB having an angle of incidence a with mirror 300 travels through the transmissive top layer TL, including structure RS, reaches mirror surface RL and is reflected back with an angle β. Note that in the drawing no account is taken of possible diffraction or refraction. Angle α may be smaller or larger than drawn in this figure. Angle α may be equal to angle β, but may also be different, depending on the indices of refraction of the materials of RS, TL, protrusions 301 and the medium over mirror 300.

Part of the radiation of beam of radiation PB may be reflected at the surface of the protrusion, which is shown by reflected beam PBr. Due to the presence of the transmissive top layer TL with structure RS according to the present invention, the reflected beam PBr is minimised and more radiation of beam of radiation PB having the desired wavelength λ in the range of 5-20 nm reaches reflective layer RL. If the top layer TL having structure RS according to the present invention were not present, more radiation having desired wavelengths λ would have been reflected, leading to loss of energy. In this way, desired radiation may be more effectively reflected, whereas radiation having undesired wavelengths may be absorbed, refracted and/or diffracted by protrusions 301. Hence, by providing this transmissive top layer TL having structure RS according to the present invention, an improved optical filter may be provided. When structure RS according to the present invention is not present, more radiation may be reflected, for example by the transmissive and/or protective layer TL without such structure according to the invention, as is the case in, for example U.S. Pat. No. 6,678, 037.

Referring to FIG. 4a, the transparent layer or top coat TL including the structure RS is not depicted on the vertical sides of the protrusions 301 or on the reflective surface RL in between protrusion 301. Neither has this been shown in FIG. 4b on the sides opposite of the angle ba. However, variations of the embodiment shown in FIGS. 4a-b also include the situation in which the sides or surfaces include a transparent top layer TL according to the present invention, as shown, for example, in FIG. 4c. The sides or surfaces do not necessarily also include structure RS.

The transmissive top layer may be provided by a CVD process. After creating a smooth top layer TL of, for example, about 2.5 nm, the CVD process may be followed by a 'rough' deposition of larger particles, for example about 5-10 nm, thereby creating structures RS in and on the transmissive top layer. The materials that are used during these two steps of the CVD process might be different, but may also be the same. The fact that sputtering by ions changes the roughness of a layer is known. Furthermore, sputter deposition and evaporation deposition techniques result in a certain roughness of a sample, depending on the deposition settings. Polishing of a layer can also be used, depending on the required roughness, the grain of the polishing material (fluid with particles) can be chosen. With optical methods, the obtained roughness can be evaluated. After this deposition, a second CVD process may be applied, to form a thin layer (not depicted in FIGS. 4a-c) on the transmissive top layer TL with structure RS. This layer may include the same material as the transmissive layer TL and/or structure RS. For example, in a variation transmissive layer TL and structure RS include Ru, and in another variation, transmissive layer TL provided by first and second CVD processes include Si and structure RS include Si.

In this embodiment and its variations, the at least partially transmissive layer TL, having a surface with the structure with an rms roughness value equal to or smaller than λ, for example after polishing, are the protrusions 301 and their surfaces 340. On the sides of the protrusions, extending from the at least partially transmissive layer, in FIGS. 4a-c reflective layer RL, and when applicable on the surface of reflective layer RL between the protrusions, the groove G, the transparent top TL layer may also be present.

Structure RS is depicted in the FIGS. 4a-c (and 5 and 6) as spherical and of equal sizes. However, the structure may have different particle sizes, shapes, etc., for example a size distribution ranging from about 0 to 20 nm, for example about 1-10 nm, or for example 2 or 5 nm. The transmissive top layer may have a thickness up to about 20, for example about 1-10.

Some variations of mirror 300 with protrusions 301 are described below, which are independent of the transmissive top layer TL including a structure RS according to the present invention.

According to another embodiment, an optical element with at least one surface includes a profile having height differences, thereby providing cavities and elevations having a predetermined maximum height difference, wherein the optical element includes a substantially flat transmissive layer in the cavities and on the elevations of the optical element according to U.S. patent application Ser. No. 10/936,716, and the optical element further includes the transmissive top layer including the structure according to the present invention.

First, this embodiment is described in general independent of the transmissive top layer TL according to the present invention, and subsequently, the top layer TL and its function are discussed.

The mirror with the grating structure in this embodiment is described as EUV optical element, but this embodiment is not limited to EUV applications.

Figure 5:
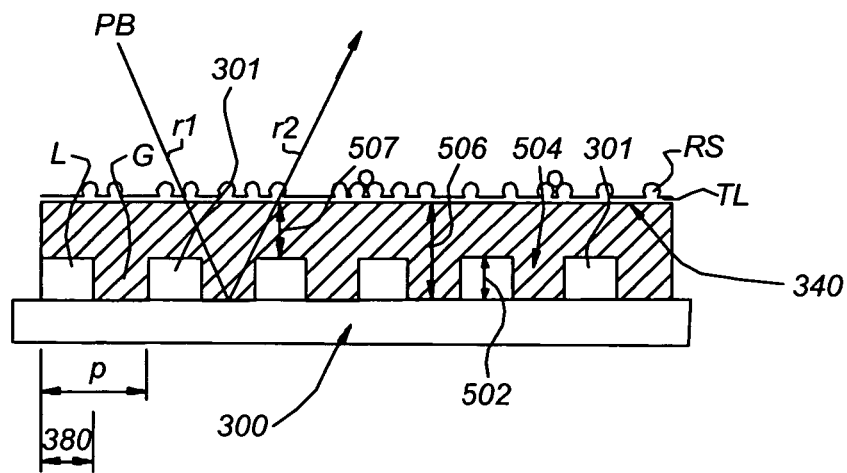
FIG. 5 schematically depicts a mirror with mirror surface protrusions in a form of a laminar square wave profile, a substantially flat (EUV) transmissive layer and a transmissive top layer according to an embodiment of the present invention.

By way of example, this embodiment is schematically depicted in FIG. 5, wherein a mirror 300 is shown having protrusions 301, wherein the protrusions form a laminar square wave profile. The protrusions have a period p, a length 380, and a height 502. Height 502 is the predetermined maximum height since all protrusions 301 have the same height. Reference L refers to "land" and reference G refers to "groove". The protrusions 301 include, for example, EUV absorbers, for example, Cr or TaN, or a Si/Mo multilayer. However, transmissive materials, for example Zr, creating a phase difference, may be used. The protrusions 301 have a height 502 and the cavities or grooves G are, according to the present invention, filled with an EUV transmissive layer 504 with height 506. The height of the EUV transmissive layer above the elevations or protrusions 301 is indicated with reference 507 (second height).

EUV transmissive layer 504, as shown in FIG. 5, may be provided by chemical vapor deposition of an EUV transmissive material, for example Si. After providing this layer in the cavities and on the elevations, the EUV transmissive layer is surfaced, for example polished, such that an EUV transmissive layer is obtained with height 507 above the elevations or protrusions 301, or a height 506 above the cavities or grooves G.

In this embodiment, the at least partially transmissive layer having a surface with a structure is the EUV transmissive layer 504, for example after surfacing. The roughness of this layer, for example after surfacing, may have an rms roughness value equal to or smaller than λ, for example. λ/2 or equal to or smaller than λ/5.

The mirror according to FIG. 5 may be used as grating, wherein the grating is used to select the desired wavelength and the EUV transmissive layer provides a protective layer which may easily be cleaned, and also provides an optical filter function by transmitting EUV radiation and absorbing part of the non-EUV radiation. The EUV transmissive layer 504 may include a material selected from Be, B, C, Si, P, S, K, Ca, Sc, Br, Rb, Sr, Y, Zr, Nb, Mo, Ru, Rh, Ag, Ba, La, Ce, Pr, Pa or U. The EUV transmissive layer 504 may also include a combination of two or more of these materials. It should be appreciated that the appropriate materials for the EUV transmissive layer 504 and the protrusions 301 may be chosen.

In an alternative arrangement, the EUV transmissive layer 504 includes a material with a complex index of refraction close to unity, for example Si. By choosing such a material for the EUV transmissive layer 504, a redesign of the grating is not necessary, as the EUV transmissive layer 504 is invisible for the EUV radiation. The EUV radiation of the beam of radiation PB may travel substantially undisturbed through EUV transmissive layer 504, as this layer is substantially transmissive for EUV radiation, and in case of Si also has a complex index of refraction close to unity. This is shown by way of example in FIG. 5, where ray r1 of beam of radiation PB travels through the EUV transmissive layer and is reflected at the mirror 300 into ray r2, without being refracted. In case materials or combinations of materials are chosen that have a complex index of refraction not close to unity, rays r1 and r2 may be refracted, which may mean that a redesigned grating structure has to be used.

FIG. 5 depicts a mirror with a grating structure having a laminar square wave profile. However, it should be appreciated that this embodiment may alternatively relate to a mirror with a sawtooth profile having an EUV transmissive layer, as well as two dimensional gratings having such an EUV transmissive layer.

The grating shown in FIG. 5, or other gratings which are included in this embodiment, may be used as the reflective elements 53, 54, 57 and/or 58 of the lithographic projection apparatus of FIG. 2.

Having described the mirror with a grating structure having a flat transmissive layer in general, the transmissive top layer TL including structure RS on top of the optical element is described.

On top of the flat transmissive layer 504, FIG. 5 shows the transmissive top layer TL according to the present invention. The transmissive top layer TL includes structure RS. A beam of radiation PB, with ray r1, travels through the transmissive top layer TL including structure RS and is reflected at the mirror 300 into ray r2. If the transmissive top layer TL with structure RS were not present, ray r1 of beam of radiation PB may be partially reflected at the surface 340 (interface of the atmosphere, usually vacuum in case of EUV, above the optical element and the surface of the flat transmissive layer 504), instead of entering the transmissive layer 504. However, due to the presence of the transmissive top layer TL with structure RS according to the present invention, reflection is reduced and the optical element of FIG. 5 can better provide its filter function of optically filtering undesired wavelengths in favor of desired wavelength λ, for example in the range of 5-20 nm. IF the structures RS according to the present invention were not present, more radiation might have been reflected, for example by the transmissive and/or protective layer TL without such structure RS. This embodiment provides the possibility of creating structure RS by polishing, as described above.

According to another embodiment, a blazed grating as a mirror with a mirror surface and a tilted multilayer stack which is tilted with respect to the mirroring surface, for example with a plurality of tilted multilayer stacks which are tilted with respect to the mirroring surface, and an EUV transmissive layer on top of this stack, according to U.S. patent application Ser. No. 10/936,716, is provided. Such a mirror provides at least one surface including a profile having height differences, thereby providing cavities and elevations having a predetermined maximum height difference, wherein the optical element includes a substantially planar transmissive layer in the cavities and on the elevations of the optical element. First, this embodiment is described in general independent of the transmissive top layer according to the present invention, and subsequently, the top layer and its function are discussed.

The blazed grating as a mirror with a tilted multilayer stack and an EUV transmissive layer on top of this stack in this embodiment is described as EUV optical element, but this embodiment is not limited to EUV applications.

Figure 6:
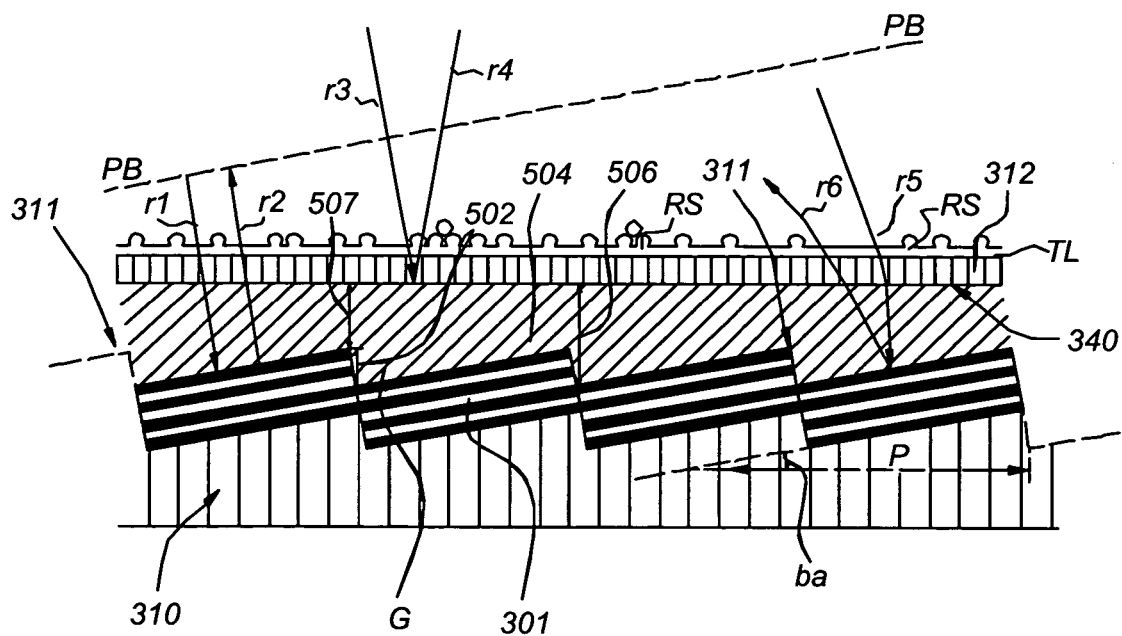
FIG. 6 schematically depicts a mirror with a tilted multilayer stack and an (EUV) transmissive layer on top of this stack and a transmissive top layer according to an embodiment of the present invention.

This embodiment describes a blazed grating as a mirror with a tilted multilayer stack and an EUV transmissive layer on top of this stack, as shown in FIG. 6. Tilted multilayer mirrors without the EUV transmissive layer, and their production are known. See, for example, Seely et al. Applied Optics 40, vol. 31, page 5565 (2001).

In FIG. 6, the multilayer surface is tilted, and a kind of tilted stack structure of multilayers is created, with protrusions 301 of multilayers, for example Si and Mo multilayers, with period p, and blaze angle ba. The tilted multilayer stack of protrusions 301 may be present on, for example, a substrate or holder 310. The protrusions or elevations 301 of multilayers form elevations with varying heights. Hence, the maximum height of a protrusions is indicated by elevation top 311. Further, cavities or grooves G are present. Here, the height difference between the bottom of the cavity G and the top 311 of protrusions 301 is height 502, which is the predetermined maximum height difference.

Over the cavities G and protrusions or elevations 301, an EUV transmissive layer 504 is provided. The height of this EUV transmissive layer 504 is indicated by reference 507 calculated from elevation top 311, or height 506 calculated from the bottom of cavities or grooves G.

When desired, a layer 312 may be present, for example to provide an extra protection or an additional optical filter function. This extra layer 312 is not only applicable in this embodiment, but may also be applied in the previous embodiments. Such layer may include Ru.

The EUV transmissive layer 504, for example of Si, may be provided by chemical vapor deposition, thereby providing an EUV transmissive layer 504 with a height larger than 502, followed by a surfacing (e.g. polishing) procedure. In this way a multilayer mirror is provided which can reflect EUV radiation, and which may deflect, reflect and/or absorb non-EUV radiation. For example, ray r1, which is radiation having an EUV wavelength (e.g. 13.5 mm, desired radiation) of beam of radiation PB, propagates undisturbed or substantially undisturbed through layer 312 and EUV transmissive layer 504 and is reflected on protrusion 301 of the tilted multilayer stack into ray r2. Taking into account diffraction of the radiation from the beam of radiation PB by the grating (not depicted in FIG. 6), the angle of incidence with which the beam of radiation reaches the surface of this tilted multilayer and/or the angle ba may be chosen, thereby determining the direction in which ray r2 is reflected.

Radiation having other wavelengths than EUV wavelengths, e.g. VIS, or IR, is reflected at the surface of layer 312 (this reflection is not shown), or reflected at the surface of the EUV transmissive layer 504. This is shown in FIG. 6 with reference r3, describing a ray with a non-EUV wavelength which is reflected at the surface of the EUV transmissive layer 504 as ray r4.

Part or all of the radiation may also be transmitted through layer 312, or through EUV transmissive layer 504, or through both layers. However, due to the differences of index of refraction between the materials (including vacuum) on both sides of the interfaces, ray r5, being a ray of beam of radiation PB having a non-EUV wavelength, is refracted. Due to this refraction, rays r5 and r6 (ray r5 reflected at a multilayer stack protrusion 301) are refracted as indicated in FIG. 6.

Since the EUV transmissive layer 504 is transmissive for radiation having EUV wavelengths, but is substantially not transmissive for radiation having non-EUV wavelengths, part of the radiation having non-EUV wavelength may be absorbed. As a result of the reflection, refraction and absorption, radiation having non-EUV wavelengths is diminished in the direction in which radiation having EUV wavelength (r2) is reflected (diffraction is not taken into account in the schematic drawing of FIG. 6). In this way, an optical filter is obtained with a substantially planar surface. The optical filter is easily cleaned and provides an optical filter for EUV radiation (e.g. 13.5 mm).

It should be appreciated that generally in the case where there is a range of predetermined maximum height differences 502, then the predetermined maximum height difference would be the height difference 502 between the deepest cavity and highest elevation or protrusion 301. Further, it should be appreciated that in such case the height 507 of the EUV transmissive layer on the elevations larger than zero (after surfacing) will generally be defined with respect to the top 311 of the highest elevation or protrusion 301, thereby providing a planar EUV transmissive layer over the protrusions and cavities.

It should also be appreciated that the present invention may also be applied to curved optical elements, the optical elements having a profile having height differences on curved surfaces, like curved mirrors or curved mirrors with grating structures, thereby taking into account that the transmissive layer will generally have the same curvature.

Having described the mirror with a tilted multilayer stack and an EUV transmissive layer on top of this stack in general, the transmissive top layer TL including structure RS on top of the optical element is described.

Referring to FIG. 6, the transmissive top layer TL is provided on layer 312. However, layer 312 may be absent, such that the transmissive top layer TL is on the planar transmissive layer 504, as in FIG. 5, i.e. on surface 340 of transmissive layer 504. In another variation of this embodiment, layer 312 may also be used as transmissive top layer TL, after providing this layer with structure RS, for example by surfacing techniques or CVD techniques, etc. Also this embodiment provides the possibility of creating structure RS by polishing, as described above.

Over the flat transmissive layer 504, FIG. 6 shows the transmissive top layer TL according to the invention. Here, the transmissive top layer TL includes structure RS. A beam of radiation PB, with ray r1, travels through the transmissive top layer TL, including structure RS and is reflected (and/or refracted; not taken into account in this figure) at mirror 300 into ray r2. If the transmissive top layer TL with structure RS were not present, ray r1 of beam of radiation PB may be reflected at the interface of the atmosphere above the optical element and the surface of the layer 312, instead of entering the transmissive layer 504. However, due to the presence of the transmissive top layer TL with structure RS according to the present invention, reflection is reduced and the optical element of FIG. 6 can provide its improved filter function of optically filtering undesired wavelengths in favor of desired wavelength λ. Further, due to the presence of the structure, less radiation may be reflected at transmissive layer TL.

According to another embodiment, the surface 340 of transmissive layer 504 is treated by a known surfacing technique, for example polishing, etching, etc. In this way, structure RS is formed and transmissive layer 504 includes transmissive top layer TL and structure RS according to the invention.

According to another embodiment, a combination of materials is chosen: transmissive layer 504 substantially includes Si and transmissive top layer TL with structure RS substantially includes Ru.

Table 2 describes the dependence of the reflection and transmission of a top layer according to the present invention with an rms roughness value of 8 nm and spatial periods equal to or smaller than λ/2 as function of the angle of incidence for two different materials for EUV radiation of 13.5 nm:

TABLE 2

Example of reflection and transmission of a top layer according to the invention

| Angle of incidence | Material | Reflection | Transmission |
|---|---|---|---|
| 10 | Ru | 0.62 | 0.26 |
| 15 | Ru | 0.45 | 0.36 |
| 20 | Ru | 0.27 | 0.43 |
| 5 | Au | 0.5 | 0.33 |
| 10 | Au | 0.23 | 0.44 |
| 15 | Au | 0.09 | 0.43 |

When the spatial period is larger than about λ/2, less transmission is obtained.

For example, assuming an rms roughness of about 8 nm and a radiation beam with radiation having a wavelength of 13.5 nm, impinging on the surface having the structure according to the invention with an rms roughness of about 8 nm, reflection will be about 45%. In less of 8 nm is found for a spatial period equal to or smaller than λ/2, then transmission is about 36% and scattering (reflection in random directions) is negligible. However, when the rms roughness of 8 nm is found for a spatial period larger than λ/2, but smaller than about 1 μm, the transmission is negligible and 36% is scattered. Hence, the present invention provides transmission gain due to the structure according to the invention.

According to another embodiment, the transmissive top layer TL including structure RS according to the present invention is provided to the mirrors which are disclosed in U.S. patent application Ser. No. 10/887,306. On the surface, or on part of the surface of the mirrors, filters and/or grating described herein, and including transmissive layer TL including structure RS according to the present invention, may be provided, thereby providing the optical filtering function of this layer to the mirrors, filters and/or grating.

Figure 7:
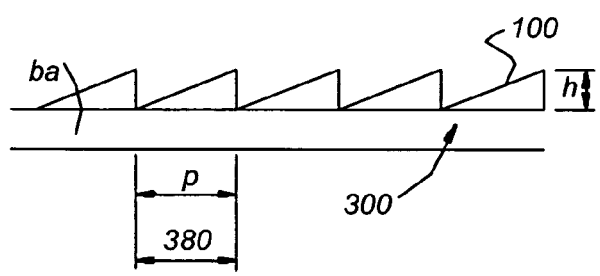
FIG. 7 schematically depicts a mirror with mirror surface protrusions in the form of a laminar sawtooth profile according to an embodiment of the present invention.
Figure 8:
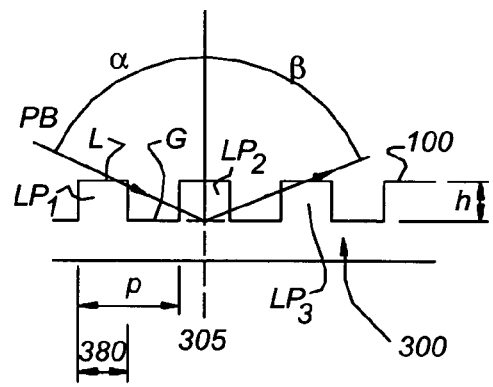
FIG. 8 schematically depicts a mirror with mirror surface protrusions in the form of a laminar square wave profile according to an embodiment of the present invention.

Referring to FIG. 7, a laminar sawtooth profile is shown, and the protrusions have a period p, a length 380, a height h, and an angle ba. FIG. 8 depicts another embodiment with a protrusion profile having a laminar square wave profile, wherein the protrusions have a period p, a length 380, and height h. Reference L refers to "land" and reference G refers to "groove". The protrusions arranged on a mirror surface of mirror 300.

When EUV radiation is reflected by the mirror 300, for example under a certain angle, only the desired EUV radiation is reflected in this angle, whereas undesired radiation, for example IR radiation, is absorbed by above mentioned materials and/or is deflected or refracted in other directions. By way of example, this is illustrated in FIG. 8. The beam of radiation PB, having an angle of incidence a hits the surface of a protrusion LP1 (laminar protrusion 1). Part of the beam may be reflected (not shown) and part of the beam, or all of the beam may enter the protrusion. Since the protrusion is transmissive for EUV radiation, this radiation propagates unabsorbed or substantially unabsorbed, whereas radiation with undesired wavelengths like UV or IR is substantially absorbed. The beam may further propagate to the next protrusion (second laminar protrusion) LP2. Reaching the left surface of this protrusion LP2, part of the radiation may again be reflected (not shown), and part of the radiation will propagate through protrusion LP2. Protrusion LP2 will also discriminate between EUV radiation and radiation with other wavelengths. When the beam of radiation PB reaches the surface of the mirror 300 (e.g. a multilayer mirror) at position 305, the beam of radiation PB is reflected with an angle β (β may be α in case of specular reflection on the surface of mirror 300). The beam of radiation PB may propagate further through protrusions LP2 and LP3. In this way, the beam of radiation PB will include a higher EUV/non-EUV radiation ratio after reflection by the mirror of the invention than before the incidence on the mirror. What has been illustrated in FIG. 8 with respect to the propagation of the beam of radiation PB may also apply for FIG. 7, where instead of laminar protrusions forming a laminar square wave profile like in FIG. 8, a laminar sawtooth profile is used.

Note that refraction of the beam of radiation PB is not depicted in FIGS. 7 and 8 (and later FIGS. 9 and 11). The above-mentioned ratio may further be improved by using a blazed or optimised grating. The mirror with the above-mentioned protrusions may, even when it is optimised or blazed at, for example, UV wavelengths, block undesired wavelengths, for example IR) but transmit EUV radiation, since Be, B, C, Si, P, S, K, Ca, Sc, Br, Rb, Sr, Y, Zr, Nb, Mo, Ru, Rh, Ag, Ba, La, Ce, Pr, Pa and U are substantially transmissive for EUV radiation, but substantially not for radiation having wavelengths other than EUV. Next to that, all these materials, including Si, have an absorption length longer than 100 nm for 13.5 nm. The protrusions can also include combinations of materials, for example. $B_4C$ or SiC.

The protrusions on mirror 300 of this embodiment are mainly present as an optical filter that is transmissive for EUV radiation, and a possible grating or diffractive structure, is substantially transmissive for the EUV radiation of the beam of radiation PB. However, due to the difference in indices of refraction when the EUV radiation enters and leaves the protrusion, there may be some diffractive losses of the EUV radiation of the beam of radiation PB.

Figure 9:
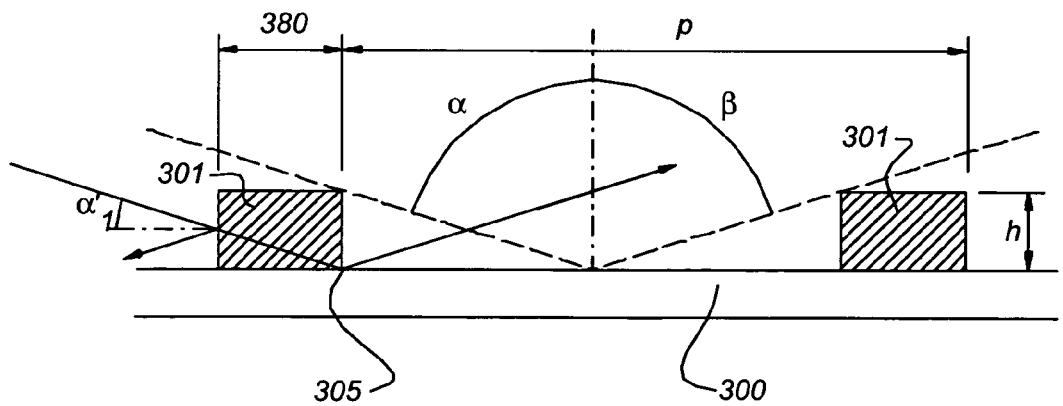
FIG. 9 schematically depicts a similar mirror as shown in FIG. 4, wherein the protrusions are arranged in such a way that a part of EUV radiation of a beam of radiation including EUV radiation, only passes one protrusion, according to an embodiment of the present invention.

In another variation, the protrusions are arranged in such a way that a part of EUV radiation of a beam of radiation including EUV radiation, having an angle of incidence between 0° and 90°, only passes one protrusion, as shown in FIG. 9, or substantially every part of the beam of radiation PB passes only one protrusion.

The profile (which may be diffractive and optimised at, for example, about 13.5 nm or other EUV wavelengths) is configured such that the desired radiation included in radiation beam PB only passes one period p of the profile and is reflected at the mirror or mirror surface 300 at position 305. The angle of incidence of the beam of radiation PB with mirror 300 is indicated with reference α, whereas the angle of incidence of the beam of radiation PB with a side surface of a protrusion is shown as $α'_1$. The angle of incidence $α'_1$ may remain small to minimise reflection of the beam of radiation PB. Also, the upper surface of the protrusions of the profile can be angled, as in a blazed grating, so that the reflection of the undesired radiation (e.g. with wavelengths higher than EUV, e.g. UV VIS and IR) on the protrusion surface is directed in a different direction than the desired radiation. The length 380 and height h of the protrusions, the period p in which the protrusions are arranged, as well as the angle of incidence α, may be chosen such that the beam of radiation PB only passes one protrusion.

The profile on the mirror can be produced by ruling (scratching a line) with a diamond tool. It is also possible to produce the profile by ion etching of a sinusoidal structure. Producing a block profile on a grazing incidence-mirror using lithographic techniques, with subsequent ion etching is also possible. The profile as shown in FIG. 9 is given as an example; other profiles are also possible, provided that EUV radiation is substantially not absorbed (i.e. is substantially transmissive), and diffraction of EUV radiation is small (e.g. less than about 30% is diffracted).

FIG. 9 shows an example of a laminar square wave profile. However, this embodiment also includes the configuration wherein a laminar sawtooth profile is used, or wherein a periodically structured sawtooth profile or periodically structured square wave profile is used.

In case a laminar sawtooth profile is used, the length 380 and height h of the protrusions, the period p in which the protrusions are arranged, and the angle ba, as well as the angle of incidence a may be chosen such that the beam of radiation PB only passes one protrusion.

Similarly this applies to the periodically structured profiles, however in such embodiment the period p includes two periods, since a two dimensional structure is formed.

This embodiment may also include a profile wherein the protrusions have a length 380 that is smaller than half a period p. This is shown in FIG. 9 for the laminar arranged square wave profile, but this may also apply for a sawtooth profile and for two dimensional profiles.

In the embodiments above, a lithographic apparatus was described in general, and mirrors including one or more protrusions including a material selected from Be, B, C, Si, P, S, K, Ca, Sc, Br, Rb, Sr, Y, Zr, Nb, Mo, Ru, Rh, Ag, Ba, La, Ce, Pr, Pa or U were described. A mirror as described above may include at least two different protrusions including two or more different materials. This will be further explained with reference to FIGS. 10 and 11.

Figure 10:
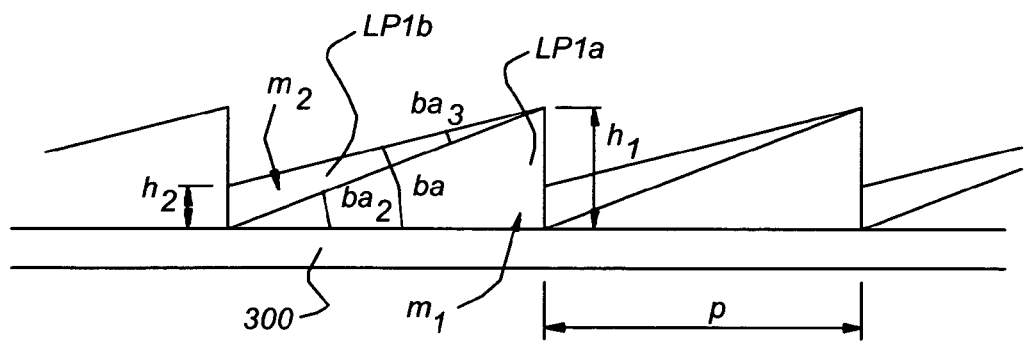
FIG. 10 schematically depicts a mirror with mirror surface protrusions in the form of a laminar sawtooth profile of two materials on top of each other, according to an embodiment of the present invention.

Referring to FIG. 10, a mirror 300 includes one or more first protrusions LP1a including a first material m1 selected from at least one if Be, B, C, P, S, K, Ca, Sc, Br, Rb, Sr, Y, Zr, Nb, Mo, Ru, Rh, Ag, Ba, La, Ce, Pr, Pa or U (protrusion LP1a), and one or more second protrusions LP1b including a second material m2 selected from at least one of Be, B, C, Si, P, S, K, Ca, Sc, Br, Rb, Sr, Y, Zr, Nb, Mo, Ru, Rh, Ag, Ba, La, Ce, Pr, Pa or U (protrusion LP1b). The first and second materials may not be the same, for example Si and Mo, Mo and Zr, C and Si, Be and Zr, etc. In another example, m1 is Be or Zr, and m2 is $Si_3N_4$ or $SiO_2$. More materials than m1 and m2, and/or more protrusions than the first and second protrusions may be applied on mirror 300. In FIG. 10, a laminar sawtooth profile on mirror 300 is shown. In contrast to the sawtooth profiles shown in FIG. 7, the laminar sawtooth profile here includes structures of two materials. The structure has a height h1, and includes the first protrusion LP1a of a first material m1, with a blaze angle ba2 and a height h1, and a second protrusion LP1b of a second material m2 with a height h2 and with a blaze angle ba3. These protrusions (of two or more materials) form together one protrusion or structure with a blaze angle ba. The protrusions may form a regular structure with period p.

The protrusions on mirror 300, as shown in FIG. 10 may form a grating that may be blazed at EUV wavelengths, but in another variation of this embodiment they may also be blazed at other wavelengths, e.g. UV, VIS or IR wavelengths.

The blaze angle ba can be chosen in such a way that undesired radiation is deflected from the direction of the desired radiation, see above. The blaze angle ba depends on angle ba2 of material m1 of the protrusion LP1a (first protrusions), angle ba3 of material m2 of the protrusion LP1b (second protrusion), and of heights h1 and h2 of the protrusions LP1a and LP1b, which are in this case on top of each other.

Figure 11:
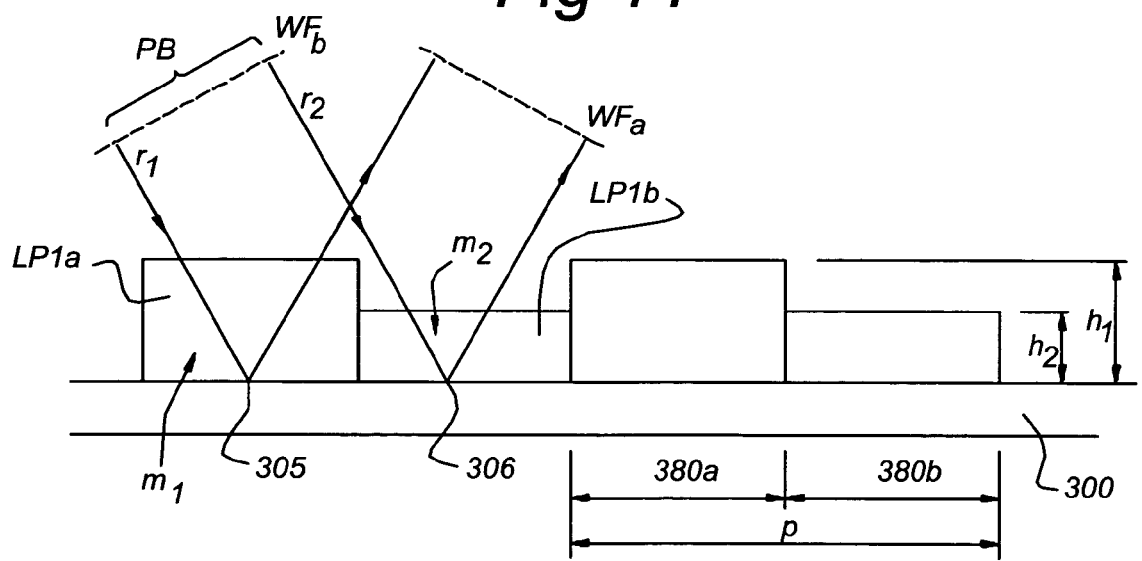
FIG. 11 schematically depicts a mirror with mirror surface protrusions in the form of a laminar square wave profile of two materials next to each other, according to an embodiment of the present invention.

As an alternative to the blazed profile, a laminar profile of the type shown in FIG. 11 may be used. As shown in FIG. 11, the laminar profile has a square wave surface profile with period p, which may be constant. The protrusions are located next to another in an alternating sequence and have different heights, i.e. protrusion LP1a of material m1 has height h1 and protrusion LP1b of material m2 has height h2. The lengths of the protrusions are shown in this figure by reference 380a for protrusion LP1a (first protrusion) of material m1 and by reference 380b for protrusion LP1b (second protrusion) of material m2. In FIG. 11, lengths 380a and 380b are the same and the length of both when added is equal to period p.

By selecting the materials based on their indices of refraction, heights h1 and h2, and when applicable lengths 380a and 380b or the angles ba, ba2 and ba3, distance (period p) of the first and second protrusions, and angle of incidence of the beam of radiation on the mirror, a mirror can be obtained that reflects at a certain angle the desired radiation while correcting by the different materials the optical path length difference, such that it does not vary over the mirroring surface, whereas light of undesired wavelengths is absorbed and/or deflected at other angles.

By way of example, this is shown in FIG. 11. Ray r1 of beam of radiation PB enters the first protrusion LP1a of material m1 and may substantially be transmitted through this protrusion and reflected at the mirror or mirror surface 300 on position 305. After being reflected, ray r1 leaves the protrusion. Ray r2, also included in beam of radiation PB, enters the second protrusion LP1b of material m2 and is reflected at position 306 at the mirror or on the mirror surface 300. Without the presence of this second protrusion LP1b, the optical path length (through the first and second protrusion and vacuum) is different for different rays. To compensate for this difference in optical path length, the second protrusion LP1b of material m2 is present. This material m2 has another index of refraction. By choosing the appropriate dimensions of the protrusions and an angle of incidence, as mentioned above, the second protrusion LP1b of material m2 can compensate for the optical path difference for the different rays in the beam of radiation PB, thereby providing an optical path length difference that does not vary over the mirror surface. This means that the optical path length difference is zero or an integer times the wavelength. The vacuum above the protrusions should also be taken into account for the determination of the optical path length difference. In this way, the optical path lengths, i.e. path length times the indices of refraction are for rays r1 and r2, starting from wave front $WF_b$, before entering protrusions LP1a and LP1b, to wave front $WF_a$, after the protrusions LP1a and LP1b, are the same or the difference between the optical path lengths for rays r1 and r2 is an integer times the wavelength (e.g. 13.5 nm radiation). Hence, in this embodiment an optical path length difference is created for EUV radiation that does not vary over the mirror surface.

For Si, having an index of refraction that is near unity for EUV radiation, the presence of such compensating second protrusions might be less necessary. However, when applying one of the other materials, the presence of the second protrusion LP1b might be desirable. Nevertheless, Si may also create a small optical pathlength difference between the different rays, as shown for r1 and r2 in FIG. 11, within a beam of radiation PB, that may be compensated for by the presence of second protrusions LP1b of Be, B, C, P, S. K, Ca, Sc, Br, Rb, Sr, Y, Zr, Nb, Mo, Ru, Rh, Ag, Ba, La, Ce, Pr, Pa or U This embodiment also includes a mirror having a mirror surface, for example in a lithographic apparatus, wherein the protrusions are arranged in such a way that a part of EUV radiation of a beam of radiation including EUV radiation, having an angle of incidence between 0° and 90°, only passes in one period p one first protrusion LP1a of material m1 and one second protrusion LP1b of material m2. This means that the length of the protrusions 380a and 380b is smaller than the period p.

This embodiment also includes a mirror wherein the profile of protrusions forms a grating, that is blazed (sawtooth) or optimised (square wave) at the desired radiation, e.g. 13.5 nm or another wavelength. Profiles of these types on mirrors may have a one dimensional or two dimensional character. Since these protrusions are transparent to EUV radiation, the desired wavelengths are reflected by the mirror 300, and the undesired wavelengths of the radiation are absorbed, refracted and/or deflected.

In general, this embodiment describes a mirror, having at least one mirror surface 300 that includes one or more first protrusions LP1a including a first material m1 and one or more second protrusions LP1b including a second material m2, and the first and second materials are not the same. Such a mirror 300 can be used as an optical filter, when the materials that are used are transparent for the desired wavelength, or optimised to be transparent for the desired wavelengths. Other wavelengths, not desired wavelengths, may be absorbed by the materials, and when a grating for a certain wavelength is chosen (grating or blazed grating), the undesired wavelengths might also be partially deflected.

This embodiment also includes a lithographic apparatus, for example as described above, including the mirror as described in this embodiment.

For providing the above described structures, the blazed structure may be provided by ruling a layer of material m1 with a diamond tool, depositing material m2, and ruling with a diamond tool for a second time. For the square shaped structures, a lithographic process may be used.

According to another embodiment, the protrusions 301 substantially include Si and the transmissive top layer TL with structure RS substantially includes Ru.

According to another embodiment, an optical element, which may be a mirror, for example a grazing incidence mirror, normal incidence mirror, multilayer mirror, is provided with a protective coating. The protective coating includes a transmissive top layer TL including structure RS according to the present invention. A protective coating is provided with enhanced transmission, with respect to a protective layer without such structure RS.

In the table below, rms values for structures of the transmissive top layer are given for different wavelengths: 5, 13.5 and 20 nm. The transmissive top layer with these rms roughness values may be present on the optical elements of the present invention, as described above in a number of embodiments. Depending upon the application and the methods used to provide to transmissive top layer and its structure, it should be appreciated that rms roughnesses in the ranges as described below may be chosen.

Further in the table, a variation on this embodiment is provided. For example, using a wavelength of about 13.5 nm, one may provide an rms roughness equal to or larger than about 1.4 nm and equal to or smaller than about 54 nm for spatial periods equal to or larger than about 2.7 nm and equal to and smaller than about 6.75 nm. It should be appreciated that smaller rms roughnesses than 54 nm may be chosen, for example an rms roughness equal to or larger than about 2.7 nm and equal to or smaller than about 27 nm for spatial periods equal to or larger than about 2.7 nm and equal to and smaller than about 6.75 nm may be provided.

TABLE 3 rms roughness values for 5, 13.5 and 20 nm for different spatial periods according to the present invention:

| λ 5.0 nm | | | | | | |
|---|---|---|---|---|---|---|
| Spatial period range (nm) | | | | Spatial period range (nm) | | |
| equal to or larger than | 1.0 — | equal to or smaller than | 2.5 | larger than 2.5 — | equal to or smaller than | 1 mu |
| RMS (nm) | | | | RMS (nm) | | |
| equal to or larger than | 0.5 — | equal to or smaller than | 20.0 | equal to or larger than 0.1 — | equal to or smaller than | 5.0 |
| RMS (nm) (variation) | | | | RMS (nm) (variation) | | |
| equal to or larger than | 1.0 — | equal to or smaller than | 10.0 | equal to or larger than 0.1 — | equal to or smaller than | 2.5 |
| λ 13.5 nm | | | | | | |
| Spatial period range (nm) | | | | Spatial period range (nm) | | |
| equal to or larger than | 2.7 — | equal to or smaller than | 6.75 | larger than 6.75 — | equal to or smaller than | 1 mu |
| RMS (nm) | | | | RMS (nm) | | |
| equal to or larger than | 1.4 — | equal to or smaller than | 54.0 | equal to or larger than 0.27 — | equal to or smaller than | 13.5 |
| RMS (nm) (variation) | | | | RMS (nm) (variation) | | |
| equal to or larger than | 2.7 — | equal to or smaller than | 27.0 | equal to or larger than 0.27 — | equal to or smaller than | 6.75 |
| λ 20.0 nm | | | | | | |
| Spatial period range (nm) | | | | Spatial period range (nm) | | |
| equal to or larger than | 4.0 — | equal to or smaller than | 10.0 | larger than 10.0 — | equal to or smaller than | 1 mu |

TABLE 3-continued rms roughness values for 5, 13.5 and 20 nm for different spatial periods according to the present invention:

| RMS (nm) | | | RMS (nm) | | |
|---|---|---|---|---|---|
| equal to or larger than | 2.0 — | equal to or smaller than 80.0 | equal to or larger than | 0.4 — | equal to or smaller than 20.0 |

| RMS (nm) (variation) | | | RMS (nm) (variation) | | |
|---|---|---|---|---|---|
| equal to or larger than | 4.0 — | equal to or smaller than 40.0 | equal to or larger than | 0.4 — | equal to or smaller than 10.0 |

For spatial periods larger than about 6.75 nm and equal or smaller than about 1 µm, the rms roughness is in this embodiment equal to or larger than about 0.1 nm and equal to or smaller than about 5.0 nm. In a variation, an rms roughness equal to or larger than about 0.1 nm and equal to or smaller than about 2.5 nm for spatial periods larger than about 6.75 nm and equal or smaller than about 1 µm may be provided.

While specific embodiments of the present invention have been described above, it will be appreciated that the invention may be practiced otherwise than as described. The description is not intended to limit the invention. Further, some of the embodiments especially describe EUV applications and EUV optical elements. However, the present invention can also be applied to optical elements for other spectral ranges, for example. UV or VIS. Further, the drawings are illustrative and provided for an understanding of the present invention. The invention is not limited to those elements shown in the schematic drawings. For example, more layers than shown may be present.

What is claimed is:

1. An optical element, comprising:
a layer of material at least partially transmissive for EUV radiation with a wavelength λ in the range of 5-20 nm, the layer of material including a material selected from the group consisting of Be, B, C, Si, P, S, K, Ca, Sc, Br, Rb, Sr, Y, Zr, Nb, Mo, Ru, Rh, Ag, Ba, La, Ce, Pr, Pa, U, and combinations thereof; and
a top layer of material including a structure having an rms roughness value, wherein transmission through the top layer is at least 30% for EUV radiation with the wavelength λ in the range of 5-20 nm, and the rms roughness value is equal to or larger than λ/10 for spatial periods equal to or smaller than λ/2, the top layer of material including a material selected from the group consisting of Be, B, C, Si, P, S, K, Ca, Sc, Br, Rb, Sr, Y, Zr, Nb, Mo, Ru, Rh, Ag, Ba, La, Ce, Pr, Ir, Au, Pa, U, and combinations thereof.

2. An optical element according to claim 1, wherein the rms roughness is equal to or smaller than λ for spatial periods larger than λ/2 and equal to or smaller than 1 µm.

3. An optical element according to claim 1, wherein the at least partially transmissive layer includes a surface with a structure with an rms roughness value equal to or larger than λ/50 and equal to or smaller than 4*λ for spatial periods equal to or smaller than λ/2.

4. An optical element according to claim 1, wherein the top layer and the structure include Ru.

5. An optical element according claim 1, wherein the optical element includes a minor having a mirror surface, the mirror surface includes a protrusion transmissive for EUV radiation with the wavelength λ in the range of 5-20 nm, and at least part of the mirror surface further includes the top layer including the structure.

6. An optical element according to claim 1, further comprising:
a profile having height differences, thereby providing cavities and elevations having a predetermined maximum height difference; and
a substantially transmissive layer in the cavities and on the elevations of the optical element, wherein the substantially transmissive layer has a planar surface on which the top layer and structure are provided.

7. An optical element according to claim 1, wherein the rms roughness value of the top layer is 2 nm or larger for spatial periods equal to or smaller than λ/2.

8. An optical element according to claim 1, wherein the optical element include's optical filters, optical gratings, mirrors or lenses.

9. An optical element according to claim 1, wherein the optical element includes a mirror with a mirror surface and a tilted multilayer stack which is tilted with respect to the mirror surface.

10. An optical element according to claim 1, wherein the layer of material at least partially transmissive for EUV radiation includes Si.

11. An optical element according to claim 10, wherein the top layer of material includes Ru.

* * * * *

UNITED STATES PATENT AND TRADEMARK OFFICE
CERTIFICATE OF CORRECTION

PATENT NO. : 8,318,288 B2
APPLICATION NO. : 10/981736
DATED : November 27, 2012
INVENTOR(S) : Levinus Pieter Bakker It is certified that error appears in the above-identified patent and that said Letters Patent is hereby corrected as shown below:

On title page, item (56) References Cited - Other Publications, line 4 replace "European Office Action issued for European Patent Application No. 04078050.4-2208 dated Mar. 6, 2007. Nayak, et al., "Characterization of Molybdenum/Silicon X-Ray Multilayers," Nuclear Instruments and Methods in Physics Research, B 199, (2003) 128-132."

with --European Office Action issued for European Patent Application No. 04078050.4-2208 dated Mar. 6, 2007.

Nayak, et al., "Characterization of Molybdenum/Silicon X-Ray Multilayers," Nuclear Instruments and Methods in Physics Research, B 199, (2003) 128-132.--.

Signed and Sealed this
Twenty-ninth Day of January, 2013

David J. Kappos
*Director of the United States Patent and Trademark Office*